(12) United States Patent
Clèment

(10) Patent No.: US 6,291,322 B1
(45) Date of Patent: Sep. 18, 2001

(54) METHOD FOR MODELING NOISES IN AN INTEGRATED CIRCUIT

(75) Inventor: François J. R. Clèment, Neuchâtel (CH)

(73) Assignee: Snaketech, Inc., San Jose, CA (US)

( * ) Notice: Subject to any disclaimer, the term of this patent is extended or adjusted under 35 U.S.C. 154(b) by 0 days.

(21) Appl. No.: 09/262,735

(22) Filed: Mar. 4, 1999

(51) Int. Cl.$^7$ .................................................. H01L 21/04
(52) U.S. Cl. ............................................ 438/510; 438/210
(58) Field of Search .................................. 438/210, 220, 438/241, 510, 540, 541–544

(56) References Cited

U.S. PATENT DOCUMENTS

| | | | | |
|---|---|---|---|---|
| 5,238,860 | * | 8/1993 | Shizuo | 438/220 |
| 6,103,561 | * | 8/2000 | Seshadri et al. | 438/210 |

OTHER PUBLICATIONS

Blalack et al., Experimental Results and Modeling of Noise Coupling in a Lightly Doped Subtrate., p.p. 23.3.1–23.3.4,, 0–7803–3393–4, 19661–EEE.*

Xavier Aragones, "A Contribution to the Study of Substrate Coupling in Mixed–Signal Integrated Circuits", Universitat Politecnica de Catalunya, Oct. 1997.

Francois Clement, "Computer Aided Analysis of Parasitic Substrate Coupling in Mixed Digital–Analog Cmos Integrated Circuits", Ecole Polytechnique Federale de Lausanne, 1996.

Tallis Blalack, "Switching Noise in Mixed–Signal Integrated Circuits", Department of Electrical Engineering, Stanford University, Dec. 1997.

Tallis Blalack et al., "Experimental Results and Modeling of Noise Coupling in a Lightly Doped Substrate", IEEE, Center for Integrated systems, Stanford University and The Hong Kong University of Science and Technology, 1996.

(List continued on next page.)

Primary Examiner—David Nelms
Assistant Examiner—Dung A Le
(74) Attorney, Agent, or Firm—Beyer Weaver & Thomas

(57) ABSTRACT

Methods and apparatus for modeling noise present in an integrated circuit substrate are disclosed. A position on a surface of the integrated circuit substrate is obtained. A combination of layers associated with the position and defining a vertical column beneath the position is ascertained. A doping profile associated with the combination of layers is obtained. The doping profile includes a plurality of portions, each of which is associated with a different range of substrate depth. Noise in the integrated circuit substrate is then modeled using the obtained doping profile.

17 Claims, 17 Drawing Sheets

OTHER PUBLICATIONS

Alan Pun et al., "Experimental Results and Simulation of Substrate Noise Coupling via Planar Spiral Inductor in RF ICs", Dept. of IEEE, The Hong Kong University of Science and Technology, Swiss Federal Institute of Technology and Hewlett–Packard Laboratory, 1997.

Martin Pfost et al., "Modeling Substrate Effects in the Design of High–Speed Si–Bipolar IC's", IEEE Journal of Solid–State Circuits, vol. 31, No. 10, Oct. 1996.

Sujoy Mitra et al., "A Methodology for Rapid Estimation of Substrate–Coupled Switching Noise", IEEE 1995 Custom Integrated Circuits Conference, 1995.

Nishath K. Verghese et al., "Fast Parasitic Extraction for Substrate Coupling in Mixed–Signal ICs", IEEE 1995 Custom Integrated Circuits Conference, 1995.

R. Gharpurey et al., "Modeling and Analysis of Substrate Coupling in Integrated Circuits", IEEE 1995 Custom Integrated Circuits Conference, 1995.

Balsha R. Stanisic et al., Addressing Substrate Coupling in Mixed–Mode IC's: Simulation and Power Distribution Synthesis, IEEE Journal of Solid–State Circuits, vol. 29, No. 3, Mar, 1994.

Kuntal Joardar, "A Simple Approach to Modeling Cross–Talk in Integrated Circuits", IEEE Journal of Solid–State Circuits, vol. 29, No. 10, Oct. 1994.

Thomas A. Johnson et al., "Chip Substrate Resistance Modeling Technique for Integrated Circuit Design", IEEE Transactions on Computer–Aided Design, vol. CAD–3, No. 2, Apr. 1984.

T.A. Johnson et al., "Chip Substrate Resistance Modeling Technique for Integrated Circuit Design", IEEE, 1983.

Ivan L. Wemple et al., "Mixed–Signal Switching Noise Analysis Using Voronoi–Tessellated Substrate Macromodels", $32^{nd}$ Design Automation Conference, 1995.

R. Singh et al., "A Practical Approach to Modeling Substrate Coupling in Realistically–Large Mixed–Signal Designs", Department of Electrical and Electronic Engineering, University of Newcastle–upon–Tyne.

Drago Strle, "Crosstalk in Mixed Signal Integrated Circuits: Problems and Solutions", University of Ljubjana.

Talliss Blalack et al., "The Effects of Switching Noise on an Oversampling A/D Converter", 1995 IEEE International Solid–State Circuits Conference, 1995.

David K. Su et al., "Experimental Results and Modeling Techniques for Substrate Noise in Mixed–Signal Integrated Circuits", IEEE Journal of Solid–State Circuits, vol. 28, No. 4, Apr. 1993.

Ranjit Gharpurey et al., "Modeling and Analysis of Substrate Coupling in Integrated Circuits", IEEE Journal of Solid–State Circuits, vol. 31, No. 3, Mar. 1996.

Nishath K. Verghese et al., "Verification Techniques for Substrate Coupling and Their Application to Mixed–Signal IC Design", IEEE Journal of Solid–State Circuits, vol. 31, No. 3, Mar. 1996.

T. Smedes et al., "Layout Extraction of 3D Models for Interconnect and Substrate Parasitics", ESSDERC'95 $25^{th}$ European Solid State Device Research Conference, The Hague, Sep. 1995.

J.P. Raskin et al., "Coupling Effects in High–Resistivity Simox Substrates for VHF and Microwave Applications", Proceedings 1995 IEEE International SOI Conference, Oct. 1995.

R.B. Merrill et al., "Effect of Substrate Material on Crosstalk in Mixed Analog/Digital Integrated Circuits", IEEE, 1994.

A. Viviani et al., "Extended Study of Crosstalk in SOI–SIMOX Substrates", IEEE Universite Catholique de Louvain, 1995.

King H. Kwan et al., "Simulation and Analysis of Substrate Coupling in Realistically–Large Mixed–A/D Circuits", IEEE Symposium on VLSI circuits Digest of Technical Papers, 1996.

Jean–Pierre Raskin et al., "Substrate Crosstalk Reduction Using SOI Technology", IEEE Transactions on Electron Devices, vol. 44, No. 12, Dec. 1997.

Nishath K. Verghese et al., "Computer–Aided Design Considerations for Mixed–Signal Coupling in RF Integrated Circuits", IEEE Journal of Solid–State Circuits, vol. 33, No. 3, Mar. 1998.

Ranjit Gharpurey et al., "Transform Domain Techniques for Efficient Extraction of Substrate Parasitics", IEEE DSPSR&D Center, Texas Instruments Inc., 1997.

W. Liu et al., "R.F. MOSFET Modeling Accounting for Distributed Substrate and Channel Resistances with Emphasis on the BSIM3v3 SPICE Model", IEEE, 1997.

* cited by examiner

= 1111

= 1010

METHOD FOR MODELING NOISES IN AN INTEGRATED CIRCUIT

This application is related to a commonly owned patent application entitled "IC Substrate Noise Modeling With Improved Surface Gridding Technique" filed on Jan. 31, 2000 (Ser. No. 09/495,078).

This application is also related to a commonly owned patent application entitled "IC Substrate Noise Modeling Utilizing Improved Doping Profile Access Key" filed on Mar. 27, 2000 (Ser. No. 09/536,206).

This application is also related to a commonly owned patent application entitled "IC Substrate Noise Modeling Including Extracted Capacitance for Improved Accuracy" filed on Mar. 27, 2000 (Ser. No. 09/536,256).

BACKGROUND OF THE INVENTION

1. Field of the Invention

The present invention relates to substrate modeling. More particularly, the present invention relates to modeling characteristics of a substrate using doping profiles.

2. Description of the Related Art

Integrated circuits are typically modeled, or simulated, prior to fabrication. These simulation tools may be used to optimize performance of integrated circuits as well as reduce the likelihood of failure of such circuits after fabrication. Thus, simulation is advantageous since circuits may be easily redesigned without duplicative fabrication costs.

Simulation tools are typically used to model the behavior of transistor devices that are formed on a substrate as well as interconnect lines that connect these devices. However, through the use of such tools, only a portion of the substrate is modeled. By way of example, during simulation of a transistor device formed on a substrate approximately 400 microns thick, a thickness of approximately 0.1 microns is typically modeled. Since net doping levels vary throughout the substrate, modeling only a fraction of the substrate yields an inaccurate simulation of the substrate characteristics. Accordingly, it would be desirable if the entire depth of the substrate were modeled.

Further, a substrate is not an ideal medium. Since recently developed fabrication processes permit device feature sizes to be reduced, the frequency of operation for transistor devices has increased with these developments. Similarly, with such a reduction in device feature size, the distance between transistor devices may be reduced. Since noise attenuates with the distance between the source of the noise (e.g., power supply) and the receiver of the noise, this parasitic noise may easily propagate to multiple devices. As a result, this parasitic noise may prevent these transistor devices from operating correctly. More particularly, these negative consequences may be considerable for sensitive semiconductor devices such as MOS transistors. Thus, it would be desirable if substrate modeling could be performed to detect this noise.

Noise may be transferred to the substrate by a circuit formed on the surface of the substrate. This noise transfer may occur at various interfaces between the circuit and the substrate. A circuit typically includes numerous devices connected by conductive interconnect lines. Capacitance as well as resistance between the substrate and an overlying interconnect line or device may create undesirable parasitic effects. As a result, this parasitic noise may be transferred through the substrate to other devices in the circuit. Thus, it would be desirable to model the interface between the substrate and the circuit.

IC substrates, as well as portions of the substrates, are typically doped. By way of example, portions of substrates may be doped to create device elements, such as source and drain diffusion regions. Thus, substrates commonly include multiple layers that contain various net doping levels. In addition, the resistance present in the substrate varies with these net doping levels. These varied resistances affect the current flow throughout the substrate and therefore the performance of integrated circuits formed on the substrate. Thus, it would be desirable if these doping levels could be considered during the substrate modeling.

In view of the above, it would be desirable if a system and method for modeling substrate noise through varying doping levels were developed. In this manner, noise flowing through the substrate as well as between the substrate and devices formed on the substrate, may be modeled and eliminated. Accordingly, a circuit may be designed to eliminate or reduce this noise at the design phase without estimation or fabrication of the circuit.

SUMMARY OF THE INVENTION

An invention is described herein which provides methods and apparatus for modeling noise present in an integrated circuit substrate. This is accomplished by obtaining a doping profile associated with the integrated circuit substrate. Through vertically discretizing the doping profile, the doping profile is divided into a finite number of discrete portions. Moreover, all doping profiles associated with the integrated circuit substrate may be obtained and vertically discretized. The integrated circuit substrate can then be modeled using one or more vertically discretized doping profiles. In this manner, speed and accuracy may be balanced during the modeling process.

According to one aspect of the invention, an integrated circuit substrate is modeled by using an associated doping profile. A position on a surface of the integrated circuit substrate is obtained. A combination of layers associated with the position and defining a vertical column beneath the position is obtained. A doping profile associated with the combination of layers is obtained. The doping profile includes a plurality of portions, each of which is associated with a different range of substrate depth. A model of the substrate may then be generated using the obtained doping profile. Such modeling may similarly be performed using a set of doping profiles.

According to another aspect of the invention, methods and apparatus for characterizing an integrated circuit substrate are disclosed. A set of one or more substrate doping profiles including a net doping level for each one of a plurality of depths within an integrated circuit substrate is obtained. A set (e.g., combination) of layers associated with the set of one or more substrate doping profiles is determined. The set of layers is in an order in relation to a surface of the integrated circuit substrate. By way of example, the set of layers may be sorted with respect to the sequence in which the layers are used during the fabrication process of an integrated circuit. The set of one or more substrate doping profiles is vertically discretized to form a vertically discretized substrate doping profile. A specific combination of layers is then associated with each vertically discretized substrate doping profile.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Figure 1:
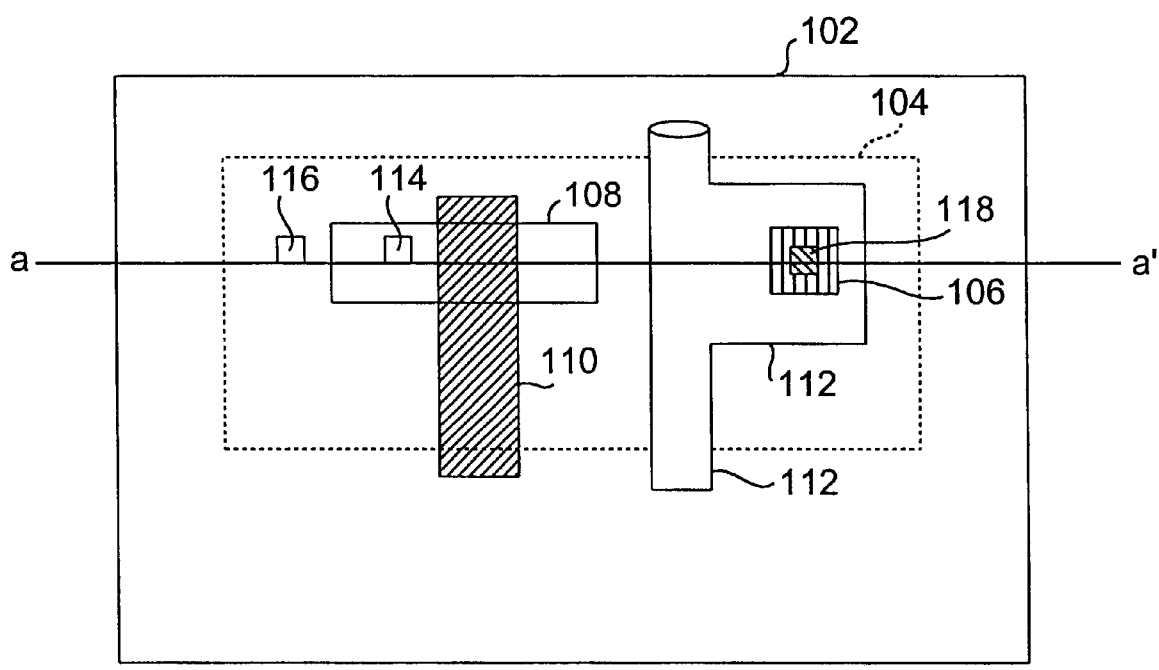
FIG. 1 is a surface view of an integrated circuit substrate in which the present invention may be implemented.

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

An invention is described herein that provides a method and system for IC substrate modeling. The substrate modeling includes modeling characteristics (e.g., electrical or thermal characteristics) of the substrate as well as characteristics at junctions between the substrate and any immediately overlying devices. Through modeling the parasitic effects of a non-ideal substrate, the degradation in ideal operation of a circuit formed on the substrate may be identified. This permits a circuit designer to modify a circuit design such that it is less sensitive to such parasitic effects. Thus, an operational circuit may be fabricated despite the fact that the substrate is a non-ideal medium. Moreover, the likelihood of circuit failure after fabrication may be significantly reduced.

According to one embodiment, a method for characterizing the technology that may be used in a particular substrate is disclosed. As described below, the technology may be characterized through the use of multiple substrate doping profiles. Each of the doping profiles represents a possible combination of doping levels that may be present in a given cross-section of the substrate. In addition, the doping profiles are "vertically discretized" to create subdivisions such that each subdivision corresponds to a range of depth within the substrate. The subdivisions may be placed such that a greater number of subdivisions are created where variation in doping level is greatest. In this manner, the number and location of the subdivisions may be selected such that a balance between accuracy and speed is realized.

According to another embodiment, noise present in the substrate may be modeled through the use of a doping profile. A vertical "column" in the substrate may be selected through selecting a position at a surface of the substrate. A combination of layers associated with this vertical column may then be obtained from a circuit layout. The doping profile associated with this combination of layers may then be obtained. Since resistance is associated with each doping level, equivalent resistances throughout the column may then be obtained. In this manner, the substrate may be modeled. In addition, the resistance and capacitance present at junctions between the substrate and overlying layers may be obtained and utilized to associate the substrate model with an existing model of the devices and/or interconnects of the circuit.

According to yet another embodiment, an integrated circuit substrate is "horizontally discretized" to create partitions across the surface of the substrate. The doping profile corresponding to each partition may then be selected and applied during the substrate modeling. The number and location of the partitions may be selected to promote accuracy as well as efficiency during the modeling process.

Referring first to FIG. 1, a surface view of an exemplary integrated circuit substrate in which the present invention may be implemented is illustrated. As shown, the integrated circuit may be a single MOS transistor. However, those of ordinary skill in the art will readily recognize that the present invention may be useful for a variety of substrates as well as an unlimited number of devices. Integrated circuit substrate 102 includes a p-well 104, p-type diffusion region 106, n-type diffusion region 108, and polysilicon 110. In addition, a metal interconnect 112 is shown. A first vertical column designated by position 114 may be obtained. Similarly, a second vertical column designated by position 116 may be obtained. The first vertical column may be associated with a first doping profile and the second vertical column may be associated with a second doping profile. Each of these doping profiles includes varying net doping levels across the depth of the substrate 102. The metal interconnect 112 is connected to the p-type diffusion region 106 through a contact 118.

Figure 2A:
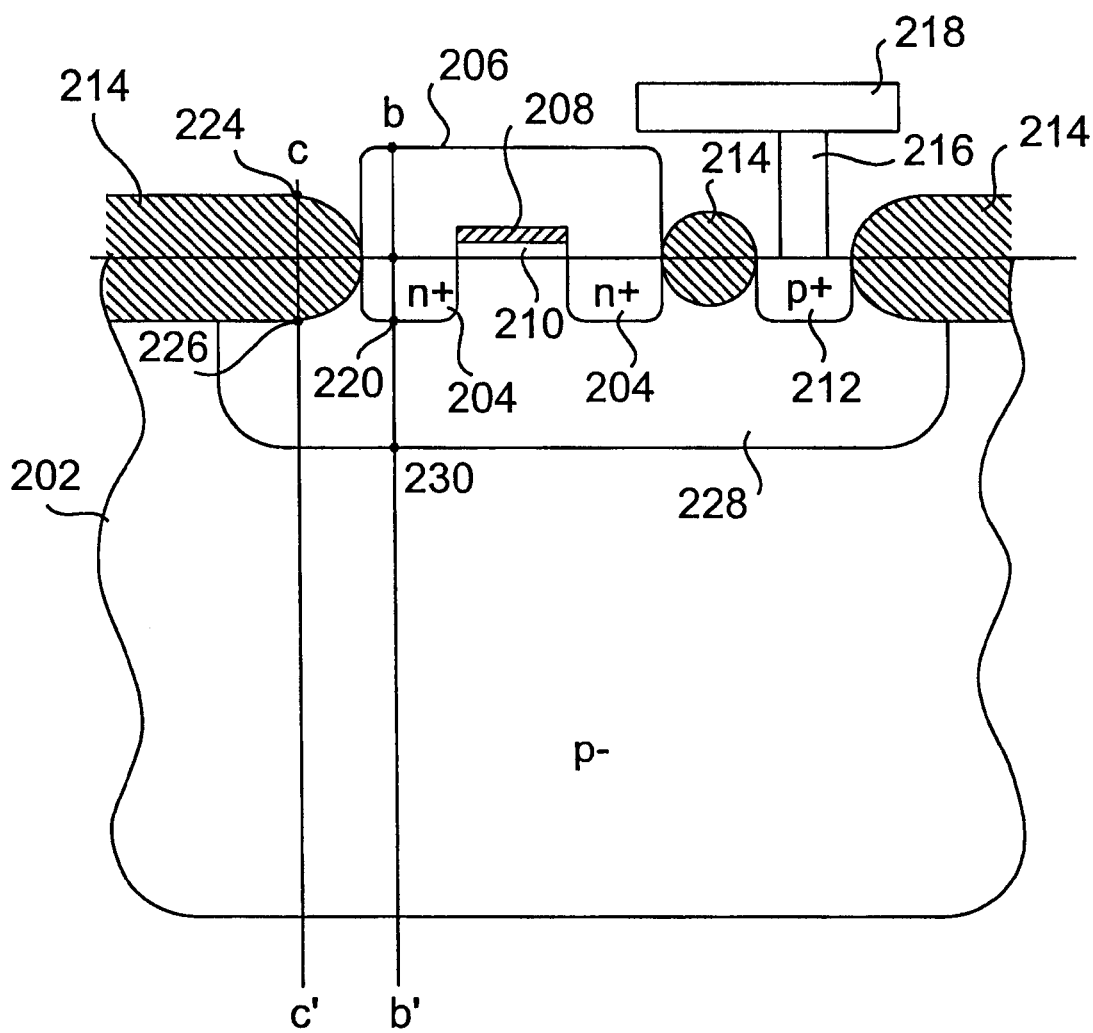
FIG. 2A is a cross-sectional view along the line a–a' of FIG. 1.

FIG. 2A is a cross-sectional view along the line a–a' of FIG. 1. Integrated circuit substrate 202 includes n+ diffusion region 204 that forms a part of integrated circuit device 206. In addition, polysilicon layer 208 is formed above dielectric layer 210. A heavily doped p+ diffusion region 212 is formed in the integrated circuit substrate 202 which may be made from silicon or other suitable material. As shown, local oxidation of silicon (LOCOS) 214 is formed in the integrated circuit substrate 202. Moreover, metal contact 216 connects metal interconnect 218 to the p+ diffusion contact region 212. The first column designated by the position 114 of FIG. 1 extends across the line b–b'. As shown, a portion of the first column 114 passes through nodes 220 and 222 within the n+ diffusion region 204. However, the n+ diffusion region 204 is part of the device 206 and is therefore modeled during device modeling rather than substrate modeling. Similarly, the second column designated by the position 116 of FIG. 1 extends across the line c–c'. A portion of the second column 116 defines the local oxidation 214 bounded by nodes 224 and 226. In addition, p-type well 228 includes the device 206. The bottom of the p-well is shown at node 230.

Figure 2B:
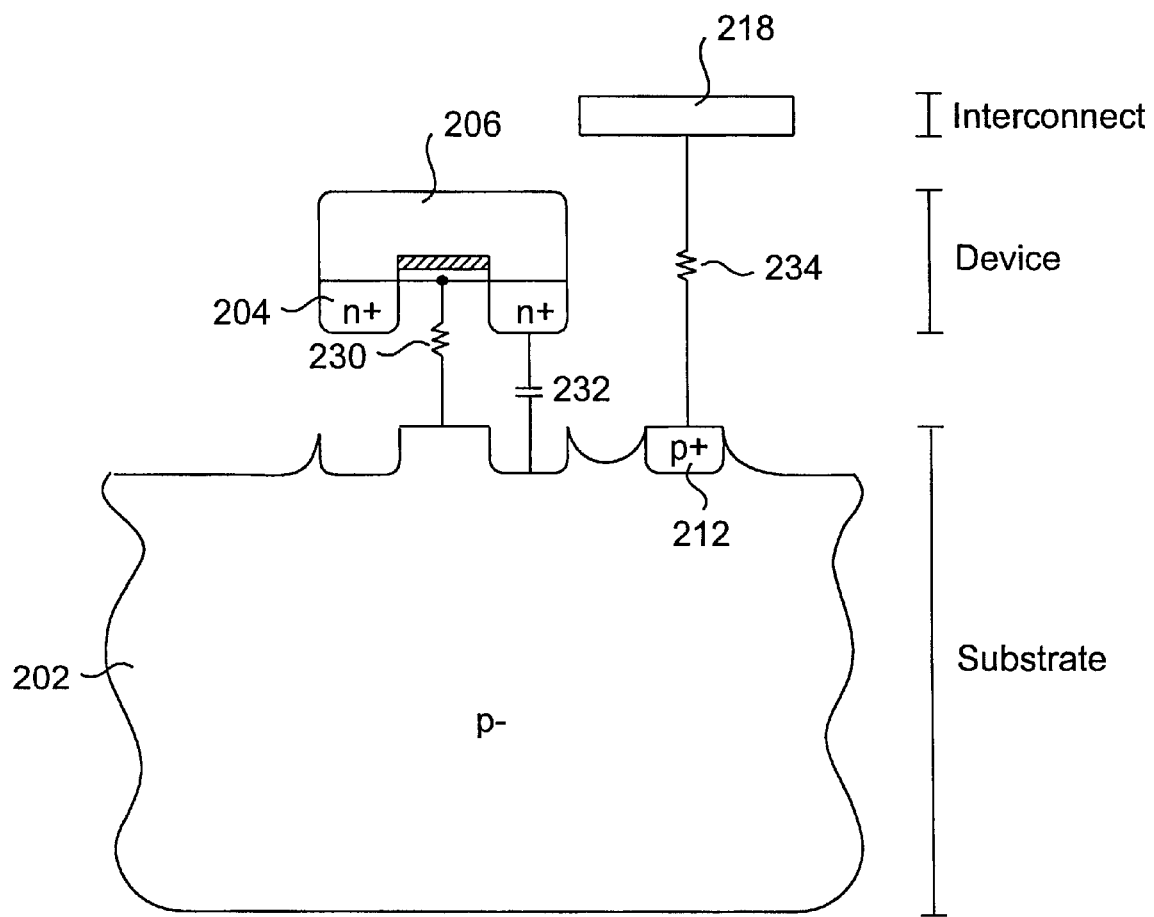
FIG. 2B is an exploded view of FIG. 2A exhibiting levels of modeling that may be used to simulate the structure illustrated in FIG. 1.

Referring now to FIG. 2B, an exploded view of FIG. 2A is illustrated. The integrated circuit substrate 202 and each interface (230, 232, and 234) between the substrate and layers directly above the substrate may be modeled according to the present invention. As shown, the integrated device 206 is connected resistively 230 and capacitively 232 by the n+ diffusion region 204 to the substrate 202. In addition, since the p+ diffusion region 212 is part of the substrate 202, the metal interconnect 218 is resisitively 234 interfacing with the substrate 202. Accordingly, the entire substrate and substrate interfaces may be modeled utilizing the present invention.

Figure 3:
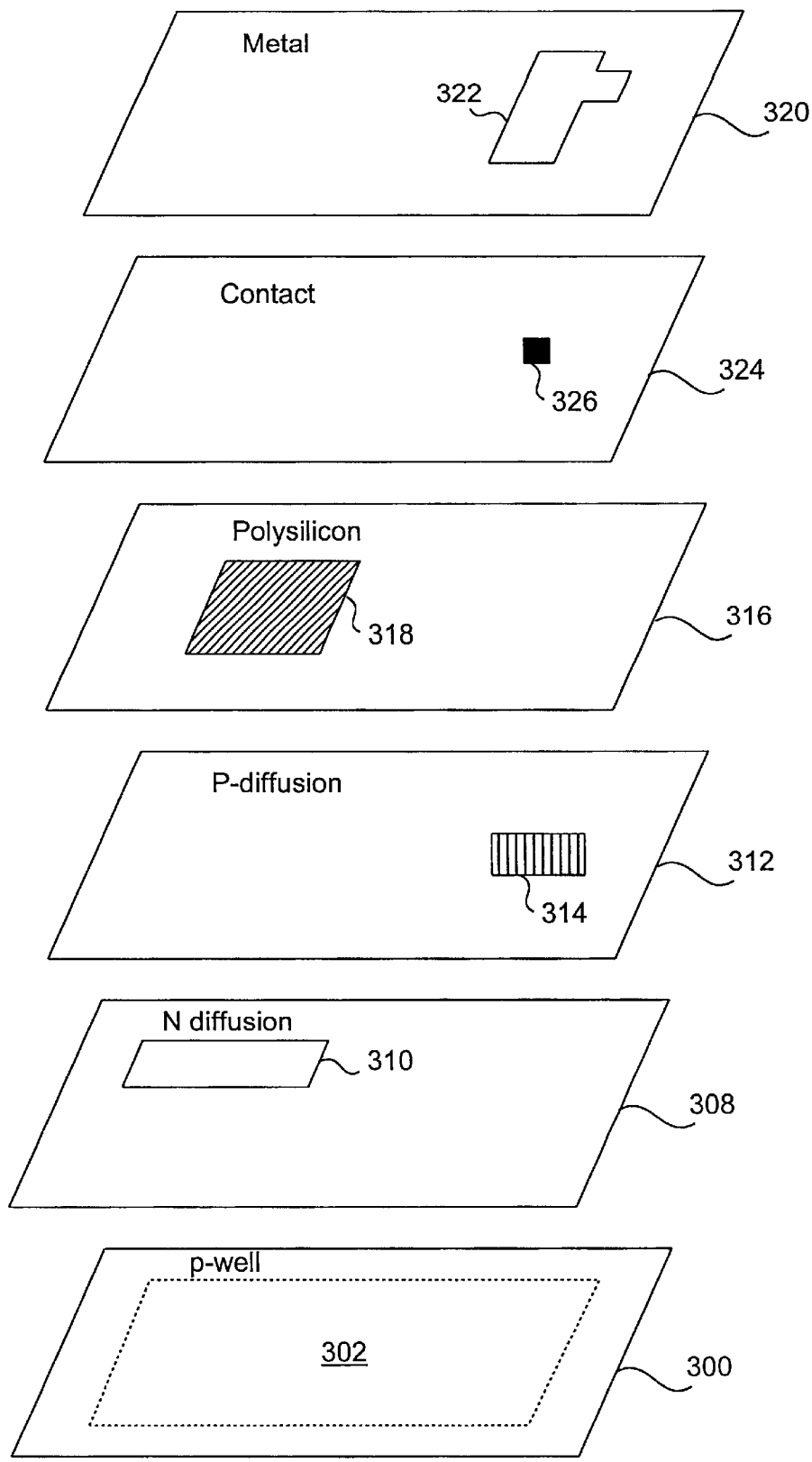
FIG. 3 is a layout view of each layer within FIG. 1 used to mask etching and implantation during the fabrication process.

A layout view of the more relevant masks used to fabricate the structure depicted in FIG. 1 is illustrated in FIG. 3. Layer 300 includes p-well 302, layer 308 includes n+ diffusion region 310, layer 312 includes p+ diffusion region 314, layer 316 includes polysilicon 318, layer 320 includes metal line 322, and layer 324 includes contact 326. These ordered layers may then be associated with a doping profile. As will be described in further detail herein, a key may be associated with each doping profile to permit a circuit layout such as that illustrated in FIG. 3 to be associated with multiple doping profiles.

Figure 4:
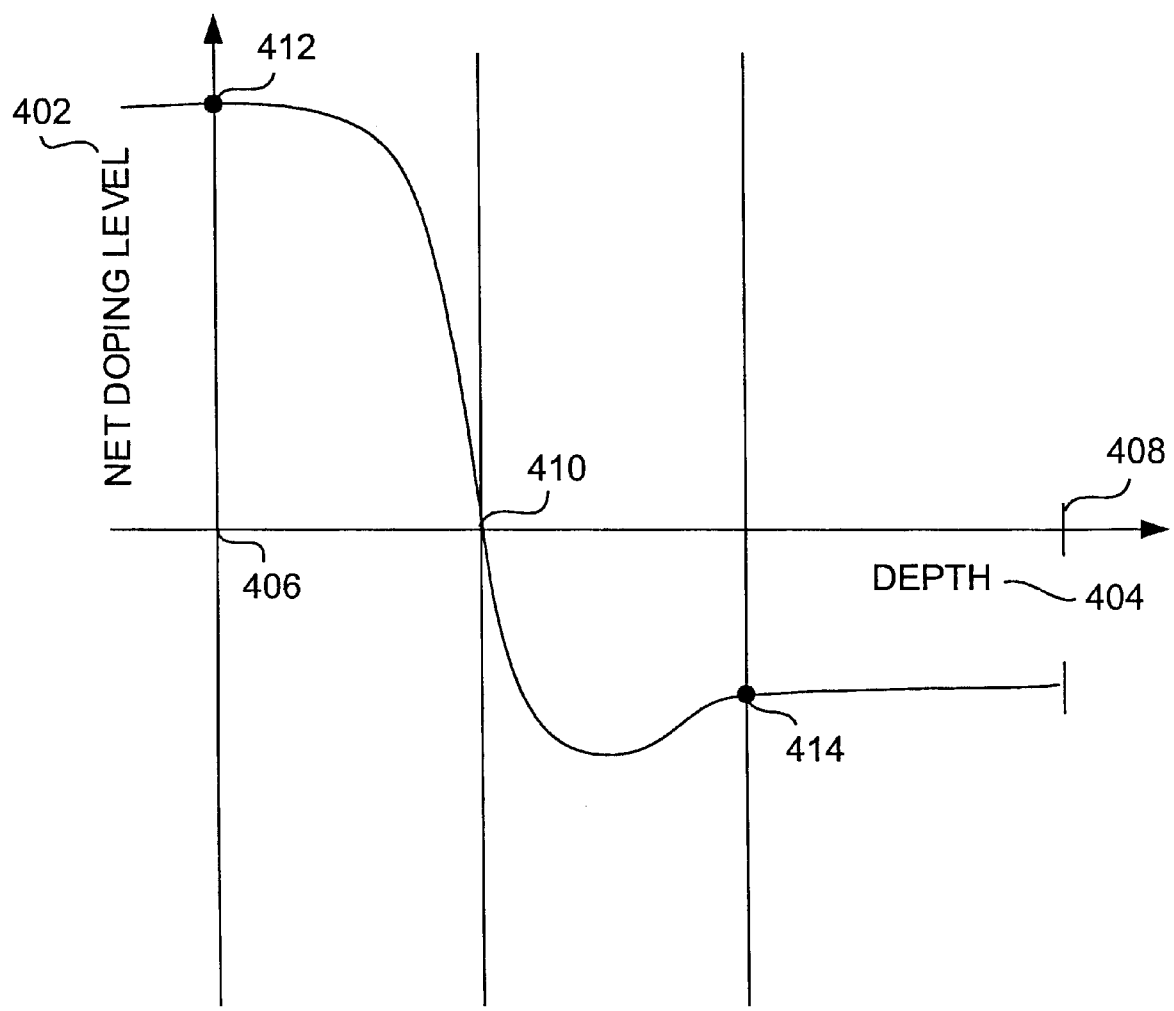
FIG. 4 is a graph illustrating an exemplary doping profile taken along the line b–b' of FIG. 2A according to one embodiment of the invention.

Each doping profile includes a net doping level obtained across a cross-section of the substrate. Referring next to FIG. 4, a graph illustrating an exemplary doping profile taken along the line b–b' of FIG. 2A according to one embodiment of the invention is presented. As shown, the graph illustrates a net doping level 402 along the y-axis and the depth 404 of the substrate along the y-axis. Thus, the top surface 406 of the substrate is designated at the point (0,0) of the graph, while the bottom of the substrate is designated at point 408. In addition, the n+ diffusion region of FIG. 2A is bounded by points 410 and 412, which correspond to the net doping level found at nodes 220 and 222 of FIG. 2A. Since this n+ diffusion region is part of the device 206 shown in FIG. 2A, this portion is not utilized during the substrate modeling. Additionally, the bottom of the p-well is shown by point 414, which corresponds to the net doping level found at node 230 of FIG. 2A.

Figure 5:
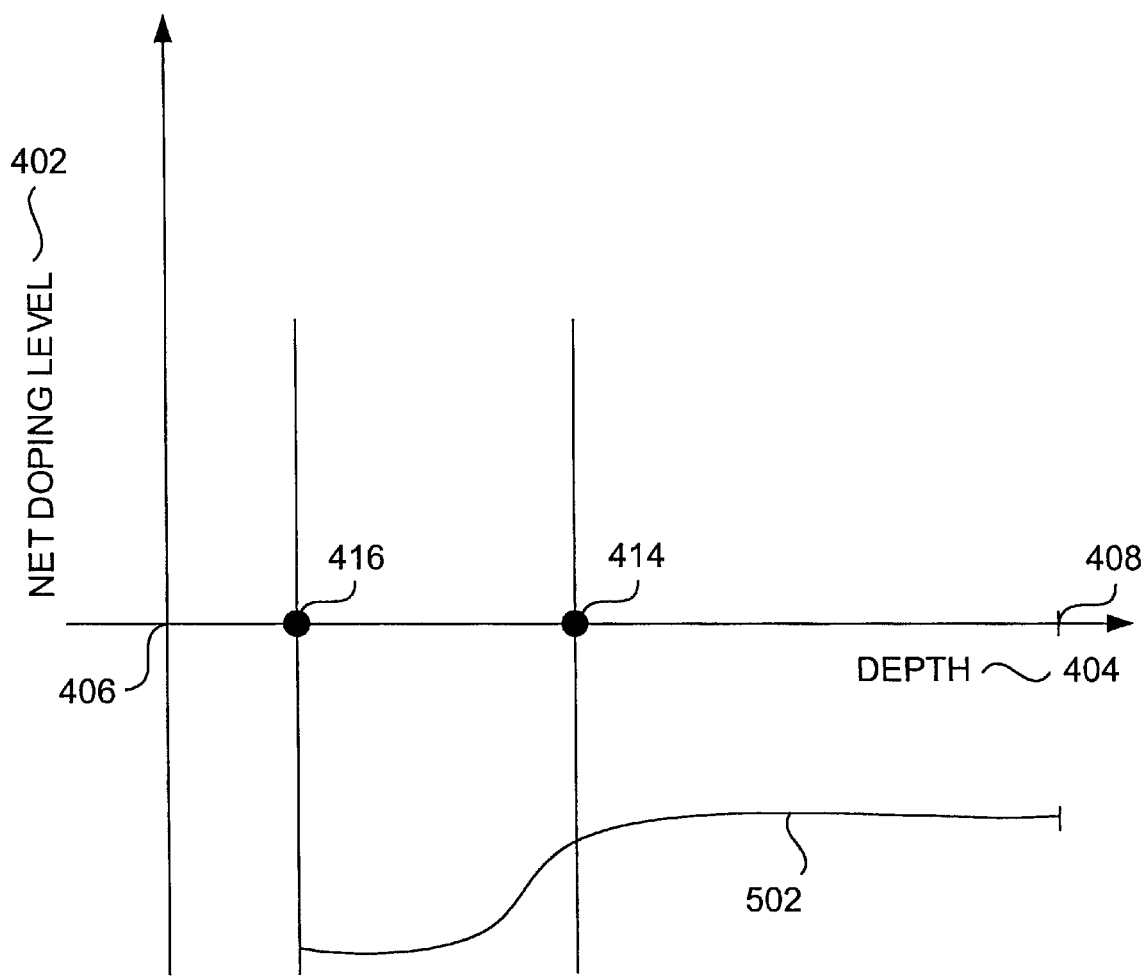
FIG. 5 is a graph illustrating an exemplary doping profile taken along the line c–c' of FIG. 2A according to one embodiment of the invention.

FIG. 5 similarly illustrates another exemplary doping profile taken along the line c–c' of FIG. 2A according to one embodiment of the invention. In this doping profile 502, the region bounded by the point 406 and point 414, which corresponds to the net doping level at the node 226 of FIG. 2A, includes LOCOS and therefore this region is not included in the substrate modeling. Moreover, as shown, the net doping level is approximately uniform from point 414 down to point 408 near the bottom of the substrate.

The doping profiles may be obtained in several ways. By way of example, net doping levels may be obtained through measurement using a tool such as a scanning electron micrograph. As yet another example, conventional simulation tools such as "TSUPREM" available from Avant!, located in Fremont, Calif. and "SSUPREM3" available from Silvaco, located in Santa Clara, Calif. may be used. Since each device element is typically repeated in multiple locations on a substrate of a typical circuit, each doping profile may be employed to represent more than one vertical column in a given circuit. By way of example, a drain or source of a MOS transistor will be repeatedly formed on the substrate. It is not necessary to provide a separate doping profile for each drain or source of these multiple MOS transistors formed on the substrate. Thus, for a typical circuit, approximately ten profiles may be sufficient to model the substrate.

Figure 6A:
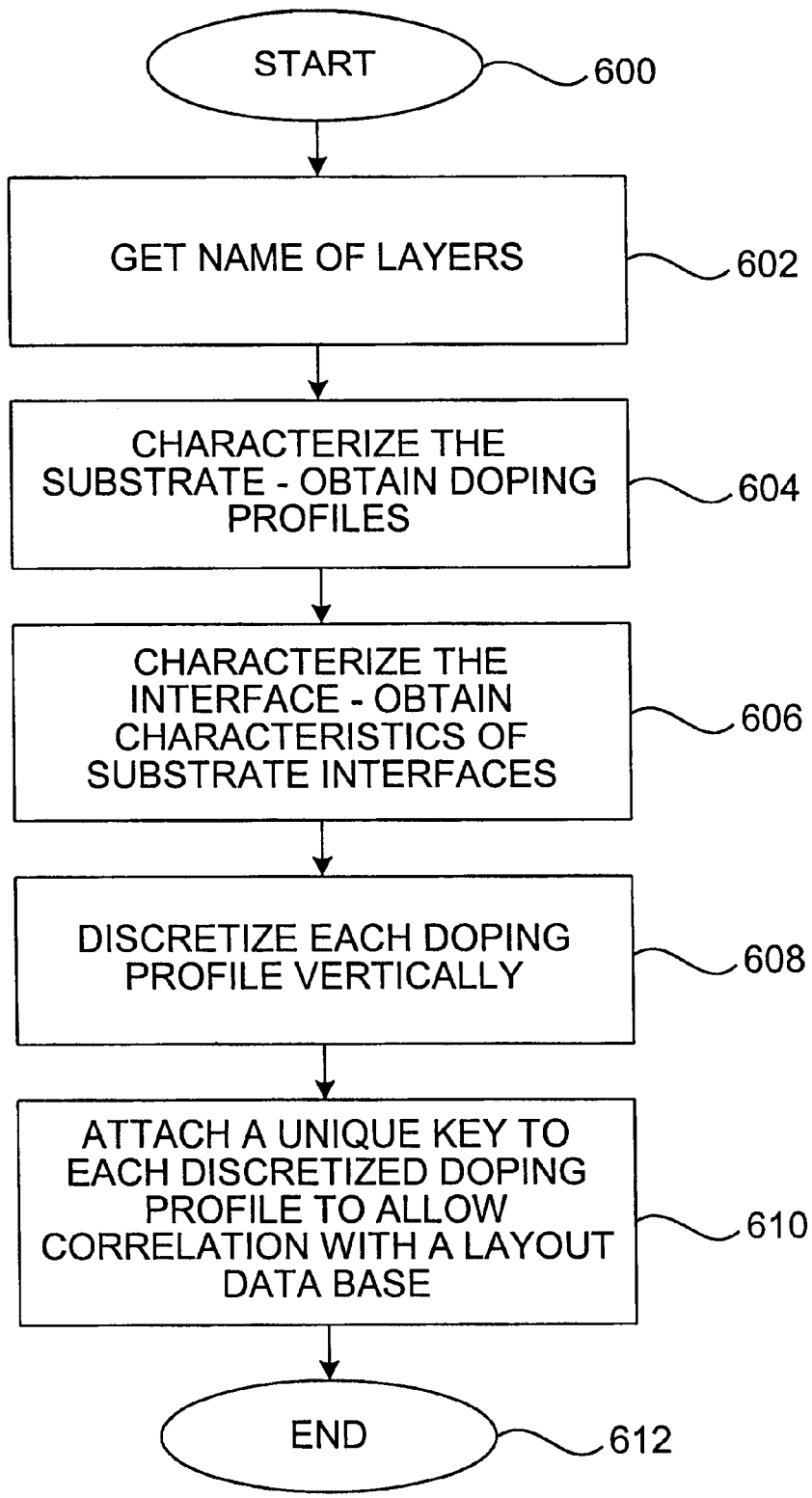
FIG. 6A is a flow diagram illustrating a method for characterizing a particular technology which may be used in a circuit layout according to one embodiment of the invention.

Prior to modeling the substrate of a particular circuit, the technology may be characterized. Referring next to FIG. 6A, a flow diagram illustrating a method for characterizing a particular technology which may be used in a circuit layout according to one embodiment of the invention is presented. The method starts at step 600. At step 602, a name for each layer that may be used in a circuit layout is obtained. By way of example, each combination of layers that may be used in a particular technology (e.g., fabrication process) may be obtained. Moreover, each combination of layers may be in an order in relation to a surface of the substrate. Next, at step 604, an integrated circuit substrate is characterized. According to one embodiment, the substrate is characterized through obtaining a substrate doping profile associated with each possible ordered combination of layers. The layer names and the substrate doping profiles may be obtained from a process engineer such that a relationship between each possible combination of layers and each one of the substrate doping profiles may be ascertained. Thus, the maximum number of substrate doping profiles is $2^n$ where n is the number of unique layers that may be used during fabrication in this particular technology. However, various combinations of these layers may not be permissible in the construction of certain devices. Thus, the number of possible combinations of layers and therefore the number of profiles will be less than this maximum number of profiles.

In addition to the doping profiles, the characteristics of interfaces between the substrate and overlaying devices or interconnects are obtained at step 606. These characteristics may include electrical characteristics such as capacitance and resistance between the substrate and an overlaying circuit layer. By way of example, the overlying layer may include interconnect lines as well as devices formed above the substrate. According to one embodiment, the capacitance and resistance between the substrate and a layer in immediate contact with the substrate are obtained. Since layers not in direct contact with the substrate are effectively shielded from the substrate by the layer that is in direct contact with the substrate, the interface with these layers may be effectively ignored. Alternatively, the capacitance and resistance between these shielded layers and the substrate layer may be orders of magnitude less than that between the substrate and the layer in immediate contact with the substrate. Moreover, other characteristics of the interface such as thermal characteristics may be obtained. The characteristics of each interface may similarly be obtained from a process engineer.

Since each doping profile includes a large number of data points, it is desirable to "compress" these data points to reduce the number of operations that are performed and therefore increase the speed of the modeling process. Thus, once the doping profiles are obtained, the data points, or values, within each doping profile may be "compressed" at step 608. Each doping profile may be compressed through "vertical discretization." However, it is imperative that this compression be performed without unduly sacrificing the accuracy of the modeling process. One method for performing the vertical discretization will be described in further detail in FIG. 8A–8D.

Next, at step 610, the ordered combination of layers is associated with the corresponding substrate doping profile. According to one embodiment, a unique key is attached to each discretized doping profile to allow correlation with a layout database during the modeling process. The unique key may be created using the ordered combination of layers that may be present in a vertical column within the substrate. The process is completed at step 612. Once the technology has been characterized, the layout information may be utilized during the substrate modeling.

Figure 6B:
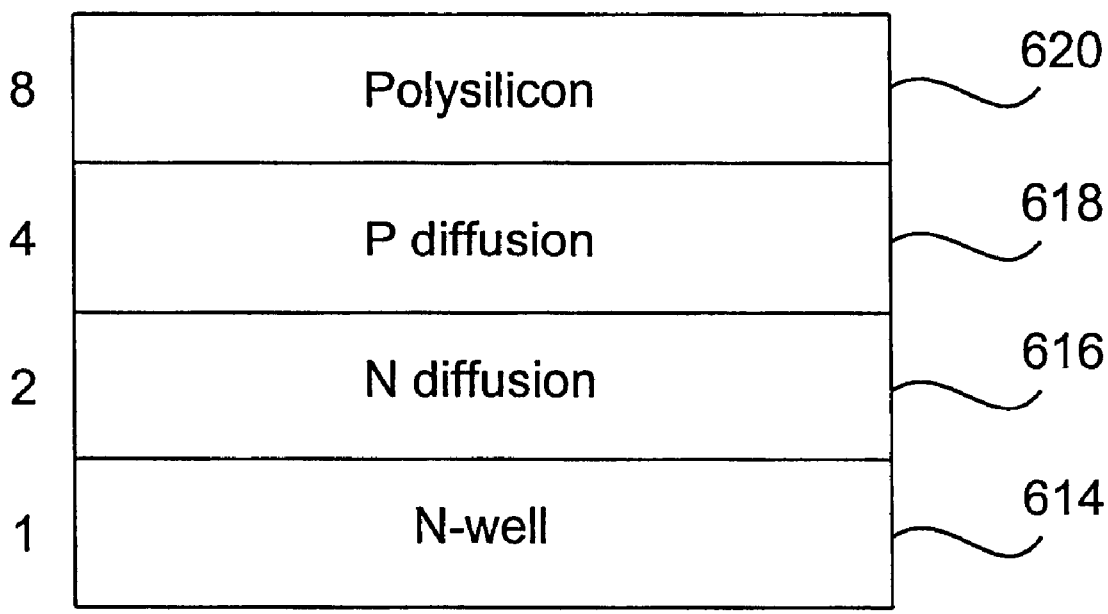
FIG. 6B is a diagram illustrating one method for obtaining a binary key to a doping profile as provided in FIG. 6A.
Figure 6B:
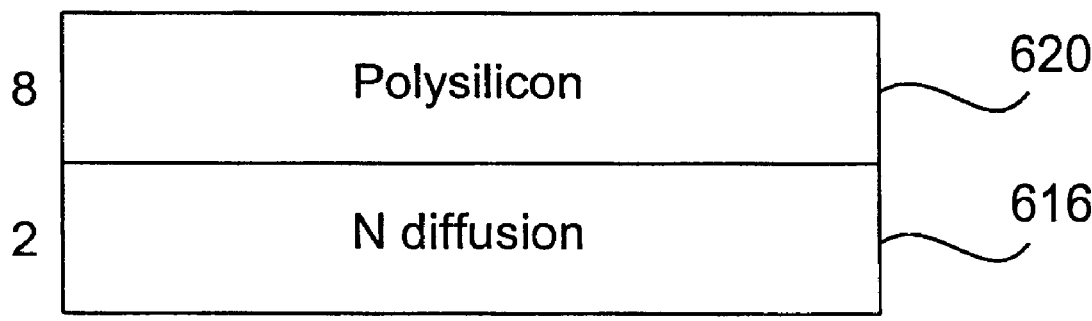

One method for obtaining a binary key to a doping profile as provided in step 610 of FIG. 6A is illustrated in FIG. 6B. Since the layers in a vertical column at a given location (x, y) are provided in a specified order, the order of the layers may be used to obtain the binary key. By way of example, each ordered layer may be associated with a binary number. A binary key may therefore be obtained by adding the binary number associated with each layer. As shown, a first layer 614 may be an n-well, a second layer 616 may be an n-type diffusion layer, a third layer 618 may be a p-type diffusion layer, and a fourth layer 620 may be a polysilicon layer. If the first layer 614 is given a value of 1, the second layer 616 is given a value of 2, the third layer 618 is given a value of 4, and the fourth layer 620 is given a value of 8, this particular vertical column of layers has a value of 15, or a binary key of 1111.

As yet another example, a doping profile may have a polysilicon layer 620 and an n-type diffusion layer 616. As described above, the polysilicon layer 620 may have a value of 8 and the n-type diffusion layer 616 may have a value of 2. Thus, a binary key of 1010 may be created.

Figure 11A:
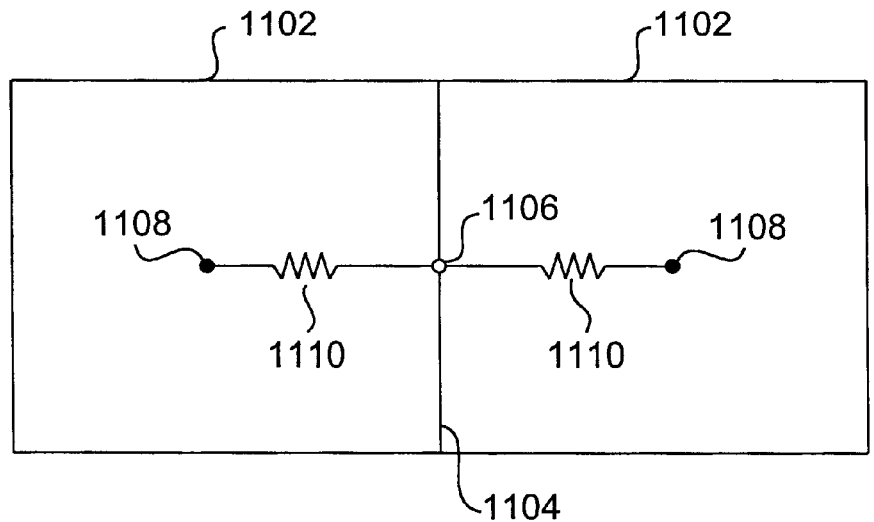
FIG. 11A is an exemplary diagram illustrating a global grid provided across a surface of the integrated circuit substrate according to an embodiment of the invention.

Horizontal discretization of the circuit may be performed to ascertain each position or area of interest in which the characterized technology is modeled. Horizontal discretization may be performed according to various methods. One method includes creating a global grid across a surface of the integrated circuit substrate. The global grid may be uniform or non-uniform. By way of example, a uniform global grid may be created such that it is aligned to the smallest component in the circuit layout. This global grid may be used where all global elements are approximately identical in size. As shown in FIG. 11A, an exemplary global grid is provided across the surface of the integrated circuit substrate. Global elements 1102 are approximately identical in size. A segment from global grid 1104 separates the global elements 1102. By way of example, the size of the global segment 1104 may be provided by the design engineer. As yet another example, the maximum number of global segments may be fixed. Accordingly, the size of the global segments may be determined by the size of the integrated circuit to be modeled divided by the maximum number of global segments. Global node 1106 of the integrated circuit substrate or substrate model connects the two global elements 1102. In addition, local nodes 1108 within the global elements 1102 are shown. A component such as resistance 1110 of the substrate model connects local nodes 1108 to global node 1106. Another method includes creating a local grid within a section of the global grid.

Figure 11B:
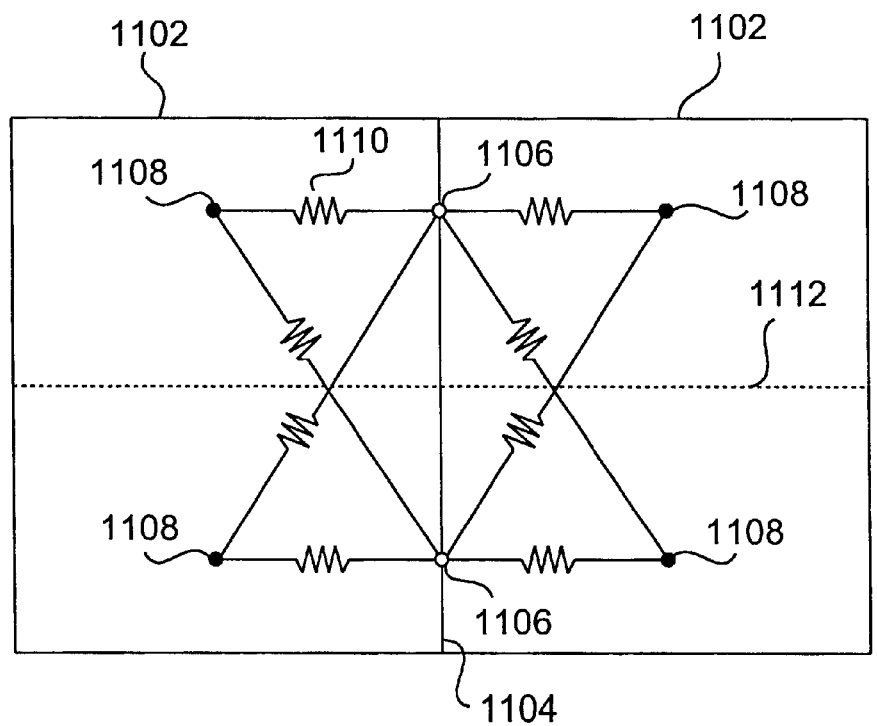
FIG. 11B is an exemplary diagram illustrating overgridding that splits a segment of the global grid according to an embodiment of the invention.

One method for creating a local grid includes overgridding. As shown in FIG. 11B, during overgridding, one or more local grid segments 1112 may be created within the global elements 1102. As shown, the global segment 1104 that is common to two global elements may be split and additional global nodes 1106 may be introduced. The global nodes 1106 may be placed along one or more of the global segments 1104 such that the global segments are subdivided into portions by the global nodes 1106. These global segment portions may be equal or unequal in length. The addition of n global nodes will create n+1 global segment portions. By way of example, as shown in FIG. 11B, the placement of an additional global node creates two additional global segment portions, resulting in two global nodes and three global segment portions. The local grid of the global element 1102 is refined by adding local grid line 1112 together with local nodes 1108. During overgridding, when a local grid line is added, the line divides the global segment 1104 and the corresponding global element 1102 or portion thereof in two portions. The portions are preferably equal but may also be unequal in dimension. By way of example, when more than one local grid line is added during overgridding, the local grid lines may be spaced evenly. As yet another example, the local grid lines may be spaced unevenly to divide the global element into portions having varying dimensions. This may be useful to provide larger portions in the middle of the global element and smaller portions near the boundary of the global element. The local nodes 1108 are then placed in the middle of each newly created portion of the global element 1102, which may be termed "local grid elements." The local grid segments 1112 increase the number of global nodes 1106 connecting two global elements 1102, as shown in FIGS. 11A and 11B. In this manner, the number of global nodes connecting two global elements may be increased when the size of the global segment is large to improve the accuracy of the substrate model.

Figure 11C:
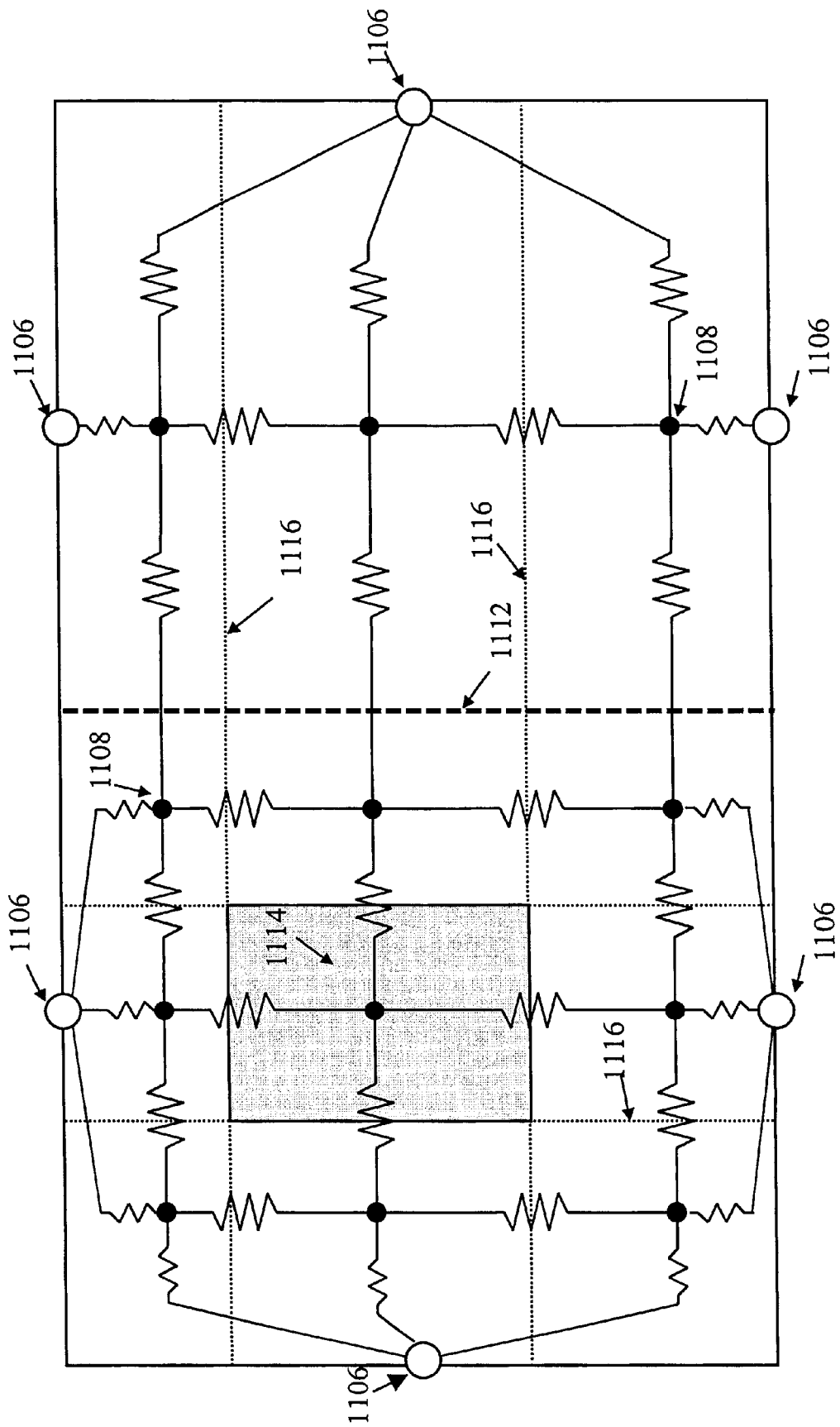
FIG. 11C is an exemplary diagram illustrating local gridding used to refine the horizontal discretization around devices and interconnect interfaces with the substrate.

Another method for creating the local grid is to add lines where the density of components (devices and interconnects interfacing with the substrate) is high. As shown in FIG. 11C, component 1114 is bounded by local grid lines 1116 and additional local nodes 1108. The local nodes 1108 are placed in the middle of the local grid elements, as described above. The global nodes 1106 are connected with the closest local nodes 1108. As a result, the local grid 1116 will be fine where the density of the components 1114 is high. As yet another example, a local grid may not be necessary where a global element contains no components. Thus, the level of resolution may be separately maximized for each global element, therefore enhancing the accuracy as well as the efficiency of the substrate modeling.

Figure 7:
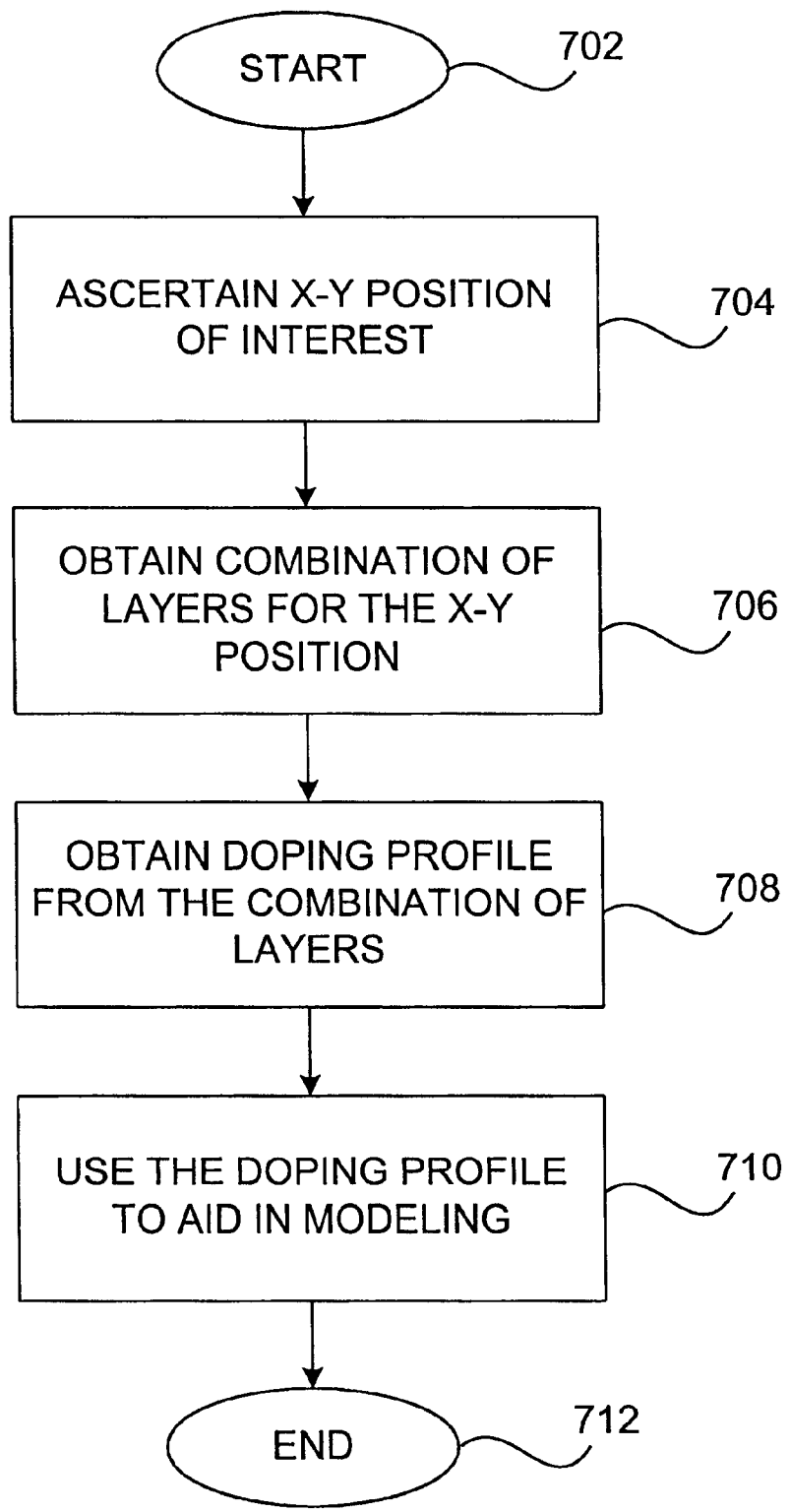
FIG. 7 is a flow diagram illustrating a method for applying the characterized technology obtained in FIG. 6A to a specific circuit layout according to one embodiment of the invention.

Once horizontal discretization of the circuit is completed, substrate modeling may be performed for each position or area defined by the horizontal discretization process. FIG. 7 illustrates a method for applying the characterized technology obtained in FIG. 6A to a specific circuit layout according to one embodiment of the invention. The process begins at step 702. At step 704, a position (x, y) of interest on a surface of an integrated circuit substrate is obtained. By way of example, a surface view of a circuit such as that illustrated in FIG. 1 may be provided, allowing a user to select the desired position. Next, a combination of layers defining a vertical column beneath the position may be obtained at step 706. By way of example, this combination of layers may be obtained from a layout database. Next, at step 708, a doping profile associated with the combination of layers may be retrieved. By way of example, the doping profile may be obtained through the use of a binary key associated with the combination of layers, as described above. The doping profile may then be used to aid in the modeling process at step 710. The process is completed at step 712.

As described in step 608 of FIG. 6A, each doping profile may be vertically discretized through creating a plurality of subdivisions across the depth of the substrate. Each one of the plurality of subdivisions may be created at a different substrate depth such that the number of subdivisions within a range of substrate depth is inversely proportional to the variation in doping level for one or more doping profiles. Thus, the number of subdivisions within each doping profile is minimized to achieve maximum speed. At the same time, a sufficient number of subdivisions are positioned to provide sufficient accuracy during the modeling process. Accordingly, speed of computation is achieved without sacrificing accuracy of the substrate modeling.

Figure 8A:
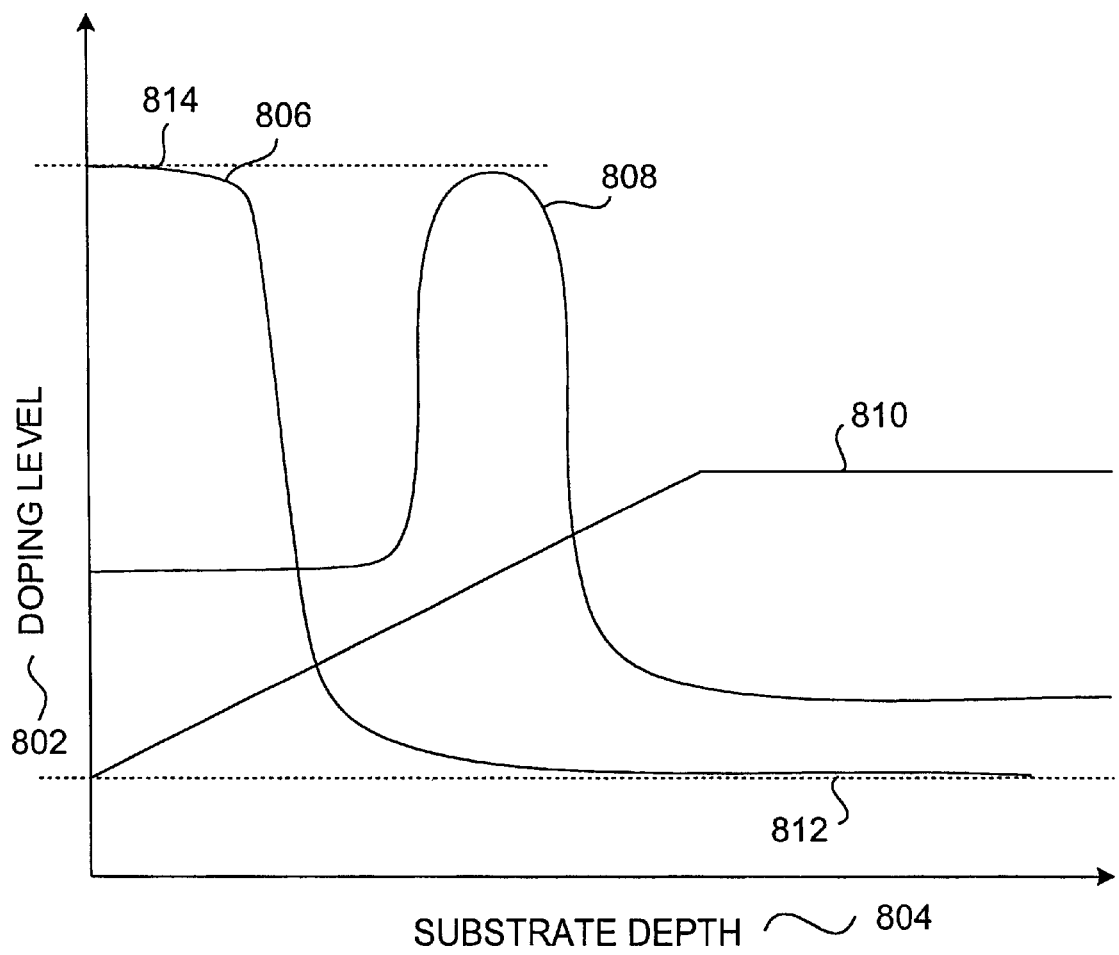
FIG. 8A is an exemplary graph superimposing multiple doping profiles which may be present in a substrate such as that illustrated in FIG. 2A.

One method for vertical discretization includes simultaneously aligning subdivisions for a plurality of doping profiles and is illustrated generally in FIGS. 8A–8D. FIG. 8A is an exemplary graph superimposing multiple doping profiles which may be present in a substrate such as that illustrated in FIG. 2A. The net doping level is illustrated along the y-axis 802 while the substrate depth is illustrated along the x-axis 804. As shown, a first doping profile 806, a second doping profile 808, and a third doping profile 810 are shown. Each level of doping translates into a resistance that is used to provide a substrate model or simulation. By way of example, lower doping levels 812 correspond to a high level of resistance. Similarly, higher doping levels 814 correspond to a low level of resistance. Thus, each doping profile has a corresponding resisitivity profile. The resistivity profile therefore includes a resistance corresponding to the net doping level at each one of the plurality of depths within the integrated circuit substrate. The resistance may be obtained from the net doping levels as provided in "Computer Aided Analysis of Parasitic Substrate Coupling in Mixed Digital-Analog CMOS Integrated Circuits" by Francois Clement, presented at the Electrical Engineering Department of (École Polytechnique Fédérale De Lausanne), 1995. This reference is incorporated herein by reference in its entirety and for all purposes. As shown, the resistance will be approximately uniform for a given doping profile as the substrate depth 804 increases. As previously described, each doping profile may contain thousands of points. Thus, it would be desirable to minimize the number of points utilized through the creation of subdivisions at selected depths in the substrate. Since it is preferable to create subdivisions at equivalent substrate depths for each of the doping profiles, it is desirable to ascertain optimum substrate depths at which to place subdivisions for all doping profiles for a given substrate.

Figure 8B:
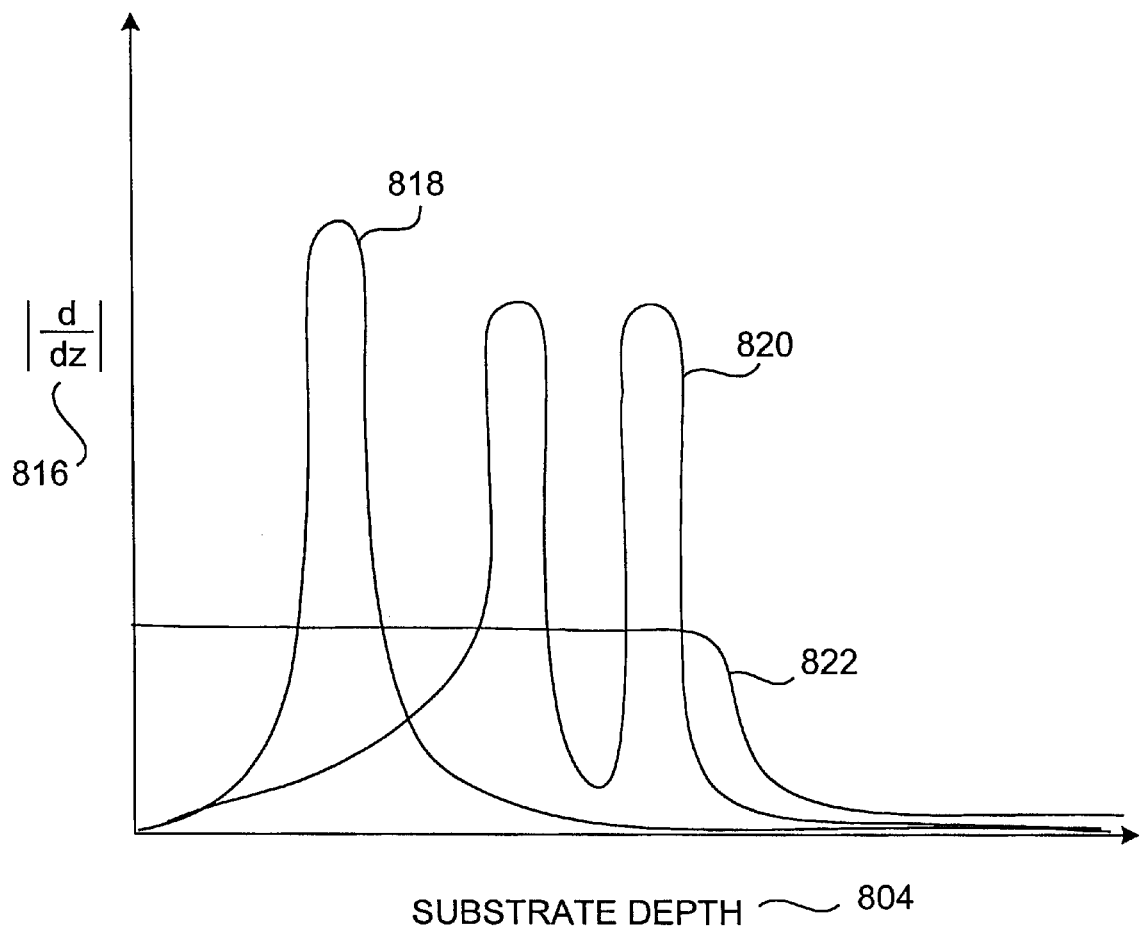
FIG. 8B is an exemplary graph illustrating the absolute values of the slopes of the resistivity associated with the doping profiles of FIG. 8A.

Since resisitivity rather than net doping level is used during substrate modeling, one method for positioning subdivisions for selected doping profiles is through determining the amount of variation of resistivity with respect to the substrate depth. This may be accomplished through ascertaining the slope of each resistivity profile. Since it is irrelevant whether the resistivity is increasing or decreasing, the absolute value of the slope may be obtained. FIG. 8B is an exemplary graph illustrating the absolute values of the slopes of the resistivity profiles of FIG. 8A. Those of ordinary skill in the art will readily recognize that the slope of each resistivity profile may be obtained through calculating the derivative of the resistivity profile curves illustrated in FIG. 8A. Thus, the absolute value of the slope is shown along the y-axis 816 and the substrate depth is shown along the x-axis 804. As shown, the absolute value of the slopes, or derivatives, of the first doping profile 818, the second doping profile 820, and the third doping profile 822 are illustrated.

Figure 8C:
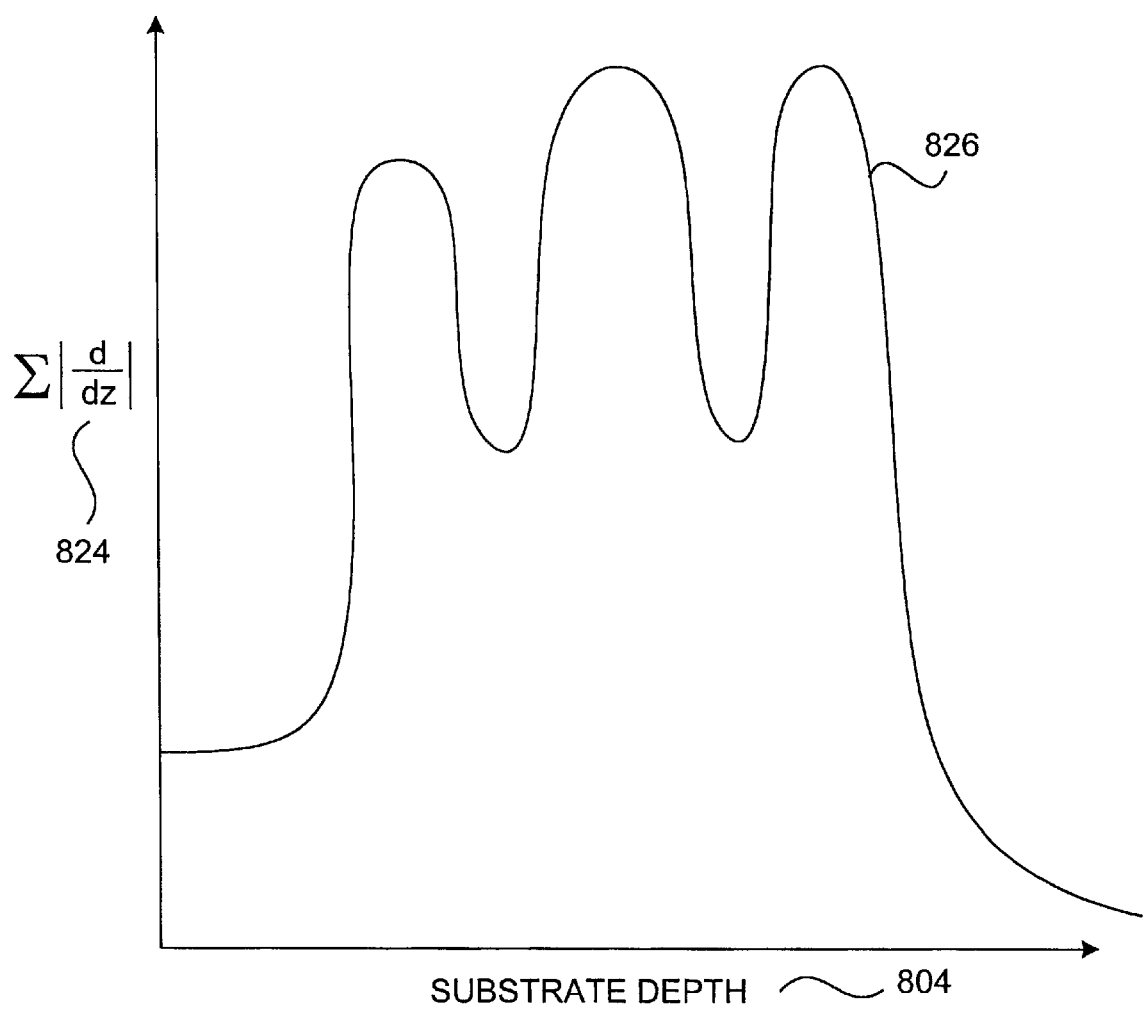
FIG. 8C is an exemplary graph illustrating the sum of the curves illustrated in FIG. 8B.

Once the resistivity variation is obtained for each of the profiles, these variations may be combined to obtain an overall variation in the resisitivity for multiple doping profiles. FIG. 8C is an exemplary graph illustrating the sum of the curves illustrated in FIG. 8B. As shown, the y-axis represents the sum of the resisitivity profile derivatives associated with multiple doping profiles 824 across the depth of the substrate, represented by the x-axis 804. Thus, the sum of the absolute values for multiple resistivity profile derivatives is obtained to yield the overall variation 826 in the resistivity.

Figure 8D:
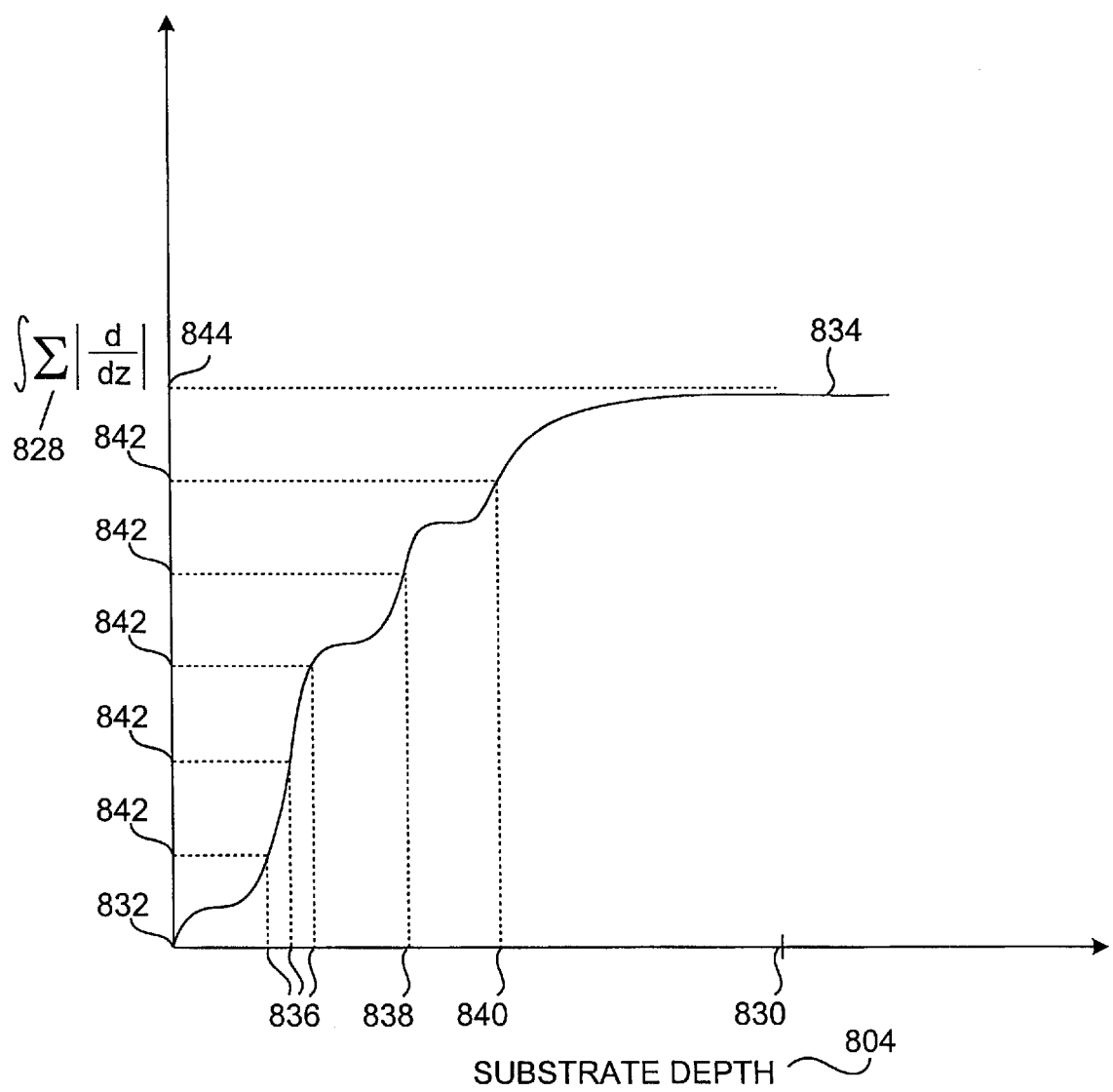
FIG. 8D is an exemplary graph illustrating the integral of the summed curve illustrated in FIG. 8C.

Through integrating the curve illustrated in FIG. 8C representing the overall variation in the resistivity, it is possible to obtain the area under the curve representing this overall variation. FIG. 8D is an exemplary graph illustrating the integrated sum 828 along the y-axis vs. the depth of the substrate along the x-axis 804. As shown, at a maximum substrate depth 830, the resistance will be approximately uniform for a given doping profile. Where there is a large variation in the resistance, a greater number of subdivisions is desirable. Thus, since the variation is greatest close to the surface 832 of the substrate, shown at the origin (0, 0), a greater number of subdivisions along the substrate depth 804 may be created.

In order to appropriately place subdivisions along the x-axis, a number of subdivisions desired may be obtained. By way of example, a processing engineer may specify a desired number of subdivisions that may be used across all doping profiles for a particular substrate. Thus, the maximum height 844 of the curve 834 may be obtained and divided by the desired number of subdivisions. In this manner, the allowed variation for each vertical subdivision may be obtained. The number of subdivisions are then superimposed on the y-axis and dropped down to the x-axis at the point of intersection with the curve 834 to create subdivision boundaries 836, 838, 840. As shown, boundaries 842 may be placed along the y-axis such that the boundaries 842 are evenly spaced along the y-axis. The boundaries along the y-axis are then correlated with the curve 834 at points of intersection to create the subdivision boundaries 836, 838, 840 along the x-axis, representing the depth of the substrate. As shown, each subdivision created along the x-axis intercepts the curve 834 as well as the corresponding boundary 842 created along the y-axis. Thus, each subdivision bounded by the subdivision boundaries (e.g., boundaries 836, 838, and 840) will correspond to a different resistance. Moreover, as shown, the subdivisions bounded by the boundaries 836, 838, 840 along the depth of the substrate will be unevenly spaced. Accordingly, where there is less change in the doping level, there will be less subdivisions along the depth.

Other methods for positioning subdivisions for multiple profiles may be utilized. Since the devices are fabricated at the substrate surface, there is a greater variation in doping level in close proximity to the substrate surface. Because a greater accuracy might be desired closer to the surface than in the depth of the substrate, it may be desirable to create a greater number of subdivisions in this region to maintain a high degree of accuracy during subsequent substrate modeling. Hence, the spacing between the boundaries (e.g., 836,

838, 840) may be decreased in proximity to the substrate surface 832 or increased along the depth of the substrate.

In order to provide greater accuracy close to the substrate surface, a spacing ratio may be applied to split the total net doping variation 844 along the depth of the substrate. The spacing ratio may be a constant value which may be multiplied by the width of a subdivision. By way of example, binary values 1, 2, 4, etc. may be utilized as multiplication factors for the width of the subdivisions as the distance from the surface of the substrate increases. Alternatively, the spacing between the boundaries 842 may be increased closer to the height of the curve 844. For example, using a multiplication factor of 2 will lead to a net profile variation for one subdivision twice as large as the variation of the previous subdivision. Accordingly, various methods may be applied to adjust the width of each subdivision.

Figure 9:
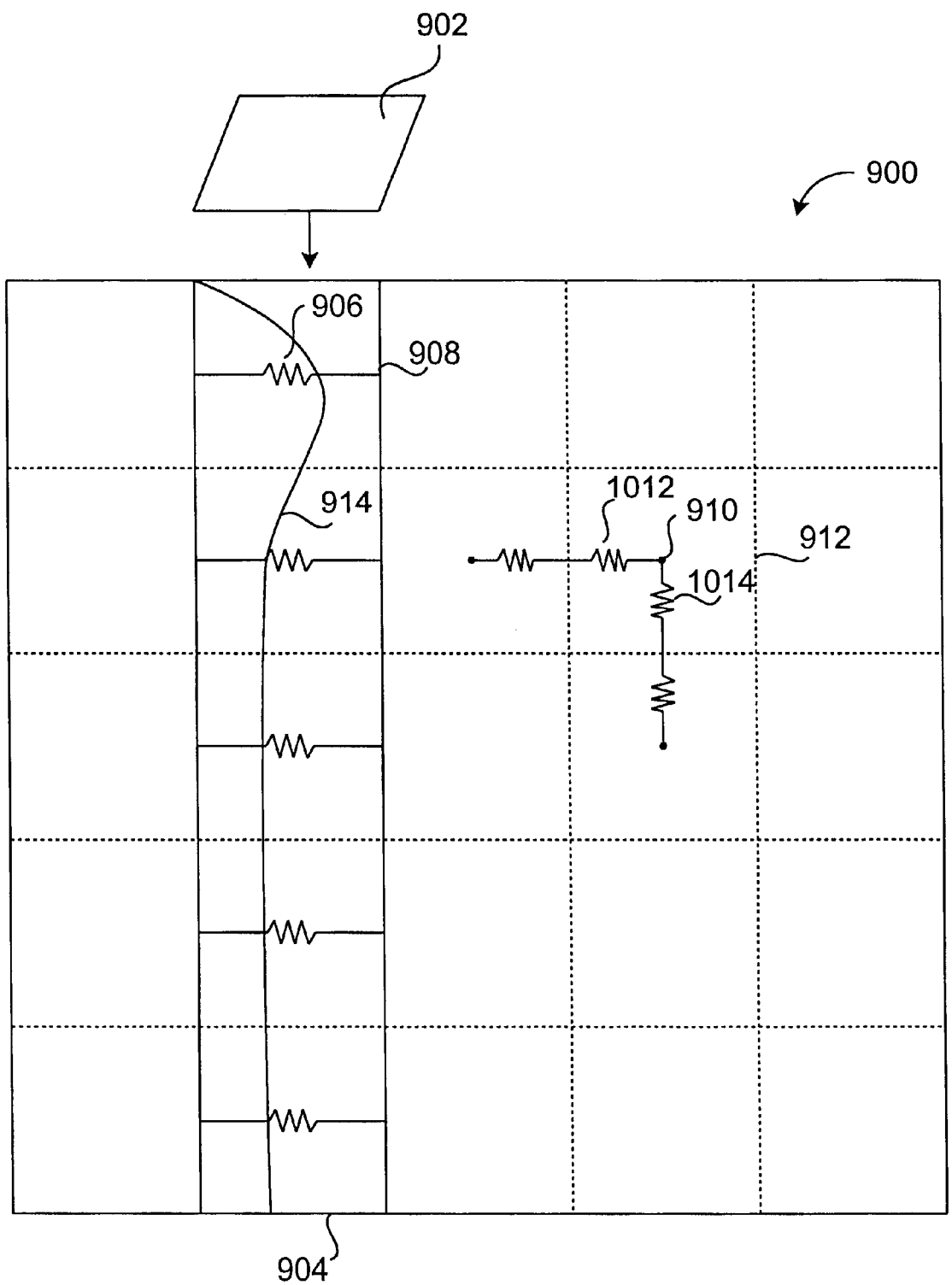
FIG. 9 is an exemplary block diagram illustrating the method for using a doping profile to aid in the modeling process of FIG. 7 according to one embodiment.

As described above, the doping level at a given substrate depth corresponds to a resistance. Thus, each partition within a given doping profile corresponds to a particular resistance that exists within a range of the substrate depth. FIG. 9 is an exemplary block diagram illustrating one method for using a doping profile to aid in substrate modeling 710 shown in FIG. 7. As shown, horizontal discretization may be performed on the substrate 900 to create a plurality of surface area subdivisions. The area 902, or position, of interest on the substrate 900 is then selected. The combination of layers for vertical column 904 defined by that position is then obtained from a layout database. The doping profile, represented by curve 914, corresponding to this combination of layers may then be obtained using a key. The doping profile 914 may then be used to ascertain the equivalent resistance 906 associated with each particular block 908 within the vertical column 904 associated with the selected area 902. In this manner, the equivalent resistance throughout each vertical column through the selected area 902, or "slice", within the substrate may be obtained. By way of example, the equivalent resistance can be computed using the algebraic average of the net doping values through a subdivision.

As shown in FIG. 9, an equivalent electrical node 910 may be identified for each block 912 within the substrate 900. An equivalent resistance associated with each cube defining the vertical column may therefore be obtained. The equivalent resistance will vary throughout the substrate due to the fabrication process and may be represented by an equivalent horizontal resistance 1012 and an equivalent vertical resistance 1014. In addition, the equivalent resistance will depend in part upon the selection of vertical columns in the substrate through horizontal discretization as well as the positioning of subdivisions in the doping profiles through vertical discretization.

Figure 10:
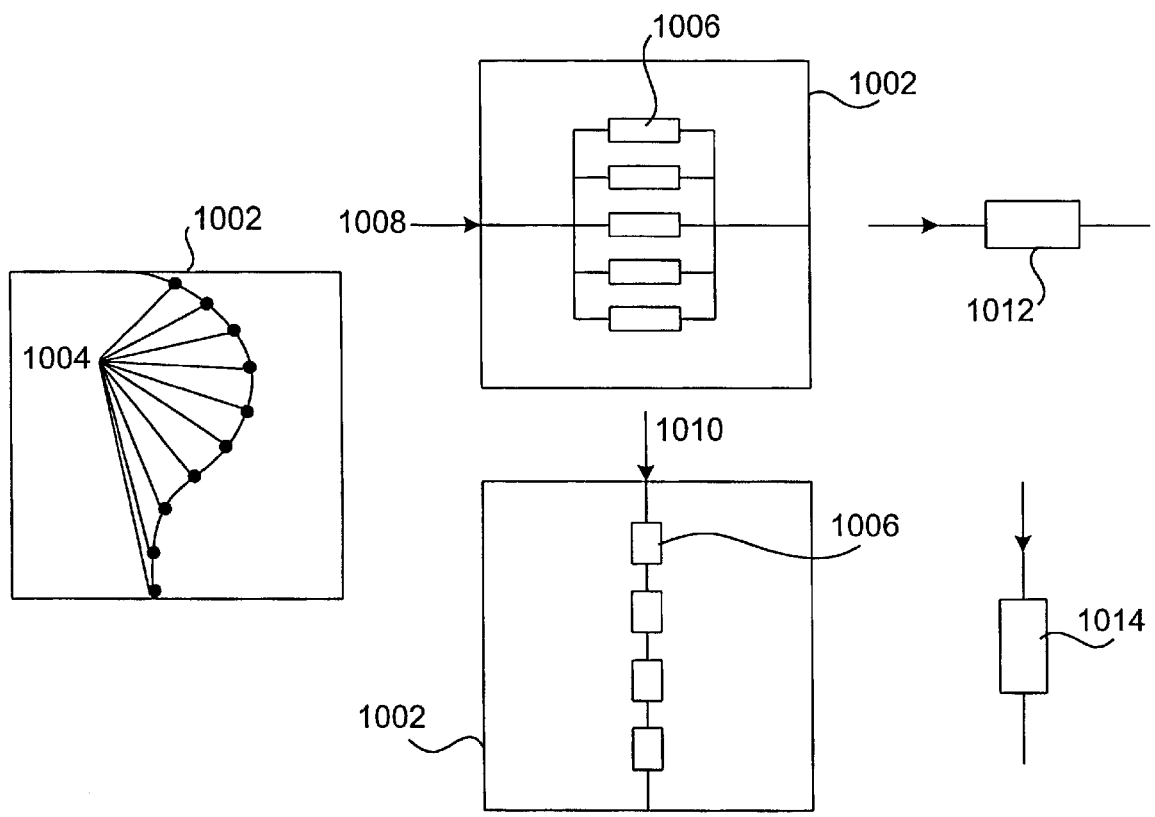
FIG. 10 is an exemplary diagram illustrating a method for determining resistances using a doping profile according to an embodiment of the invention.

FIG. 10 is an exemplary diagram illustrating a method for determining equivalent resistances using a doping profile according to an embodiment of the invention. The accuracy of the substrate model can be improved by distinguishing currents that flow horizontally from currents flowing vertically within a block 1002. After the vertical discretization process, the net doping level within a block will change as a function of the vertical position. As illustrated in FIG. 10, the block 1002 is characterized by a discrete number of net doping values 1004 corresponding to a doping profile. Each doping value 1004 further corresponds to a resistance value 1006. Each resistance 1006 is seen in parallel by a lateral current 1008 and in series by a vertical current 1010. Thus, the equivalent vertical resistance 1012 may be defined by the sum of the resistances 1006 in the block 1002. Correspondingly, the horizontal equivalent resistance 1014 may be defined by $1/(\Sigma(1/R))$ for the resistances 1006.

Once the equivalent resistance is ascertained for each subdivision and block within the substrate, these values may be used to model the noise in the substrate. By way of example, a resistive matrix may be created that includes the equivalent resistance at each node within the substrate. Thus, the resistance and the capacitance at the junction between the substrate and the overlying layer may be combined with the equivalent resistance at each node within the substrate. Using these values, a netlist may be created according to a conventional process. In this manner, RC substrate modeling may be performed.

The present invention provides numerous advantages. Through utilizing doping profiles, substrate characteristics may be accurately and efficiently modeled. Moreover, through creating vertical subdivisions in these doping profiles, the accuracy and efficiency of this modeling is maximized. Similarly, through creating horizontal subdivisions in an integrated circuit substrate, the doping profiles may be accurately and efficiently utilized during the modeling process.

The present invention may generally be implemented on any suitable computer system. The computer system may include any number of processors that may be coupled to memory devices such as a read only memory (ROM) or a random access memory (RAM). In addition, it is contemplated that such a computer system might be connected to a network to receive information from the network or output information to the network.

The invention can also be embodied as computer readable code on a computer readable medium. The computer readable medium is any data storage device that can store data which can thereafter be read by a computer system. Examples of the computer readable medium include read-only memory, random-access memory, CD-ROMs, magnetic tape, and optical data storage devices. The computer readable medium can also be distributed over a network between coupled computer systems so that the computer readable code is stored and executed in a distributed fashion.

Although illustrative embodiments and applications of this invention are shown and described herein, many variations and modifications are possible which remain within the concept, scope, and spirit of the invention, and these variations would become clear to those of ordinary skill in the art after perusal of this application. For instance, the present invention is described as modeling electrical characteristics of a substrate. However, it should be understood that the invention is not limited to modeling characteristics of this type, but instead would equally apply regardless of the characteristics modeled. Accordingly, the present embodiments are to be considered as illustrative and not restrictive, and the invention is not to be limited to the details given herein, but may be modified within the scope and equivalents of the appended claims.

What is claimed is:

1. A method for characterizing an integrated circuit substrate, comprising:

obtaining a substrate doping profile, the substrate doping profile including a net doping level for each one of a plurality of depths within an integrated circuit substrate;

obtaining a combination of layers associated with the substrate doping profile, the combination of layers being in an order in relation to a surface of the integrated circuit substrate;

vertically discretizing the substrate doping profile to form a vertically discretized substrate doping profile; and associating the combination of layers with the vertically discretized substrate doping profile.

2. The method as recited in claim 1, wherein associating the combination of layers includes:

attaching a key to the vertically discretized substrate doping profile, the key being obtained from the combination of layers.

3. The method as recited in claim 1, wherein vertically discretizing includes:

creating a plurality of subdivisions in the substrate doping profile such that each one of the plurality of subdivisions corresponds to a different range of substrate depth.

4. The method as recited in claim 3, wherein creating the plurality of subdivisions includes:

ascertaining a variation in resistivity for the doping profile; and providing each one of the plurality of subdivisions at a different substrate depth such that the number of subdivisions in a range of substrate depth is inversely proportional to the variation in resistivity.

5. The method as recited in claim 3, wherein creating the plurality of subdivisions includes:

providing each one of the plurality of subdivisions at a different substrate depth such that the number of subdivisions in a range of substrate depth increases as the distance to the surface of the integrated surface substrate decreases.

6. The method as recited in claim 1, further including:

repeating the steps of obtaining the substrate doping profile, obtaining the combination of layers, vertically discretizing, and associating for each one of a plurality of doping profiles.

7. The method as recited in claim 6, wherein vertically discretizing includes:

ascertaining an overall variation in resistivity for the plurality of doping profiles; and creating a plurality of subdivisions using the overall variation in resistivity, each one of the plurality of subdivisions corresponding to a different substrate depth.

8. The method as recited in claim 6, wherein vertically discretizing further includes:

ascertaining a resistivity profile associated with each one of the plurality of doping profiles, the resistivity profile including a resistance corresponding to the net doping level at each one of the plurality of depths within the integrated circuit substrate;

determining a derivative of each one of the plurality of resistivity profiles;

ascertaining an absolute value of the derivative of each one of the plurality of resistivity profiles;

summing the absolute value of the derivative of each one of the plurality of resistivity profiles to obtain a summed value;

integrating the summed value;

dividing the integrated summed value by a number of subdivisions; and ascertaining a depth associated with each one of the subdivisions, wherein the depth correlates with the integrated summed value at each one of the subdivisions.

9. A method for modeling noise present in an integrated circuit substrate, the method comprising:

ascertaining a position on a surface of the integrated circuit substrate;

obtaining a combination of layers associated with the position, the combination of layers defining a vertical column beneath the position;

obtaining a doping profile associated with the combination of layers, wherein the doping profile includes a plurality of portions, each of the portions associated with a different range of substrate depth; and modeling noise in the integrated circuit substrate using the obtained doping profile.

10. The method as recited in claim 9, wherein obtaining a doping profile includes:

determining a key associated with the combination of layers; and retrieving the doping profile associated with the key.

11. The method as recited in claim 9, wherein modeling noise in the integrated circuit substrate includes:

ascertaining an equivalent resistance associated with each one of the plurality of portions in the obtained doping profile.

12. A method for modeling noise present in an integrated circuit substrate, the method comprising:

ascertaining a position on a surface of the integrated circuit substrate;

obtaining a combination of layers associated with the position, the combination of layers defining a vertical column beneath the position;

obtaining a doping profile associated with the combination of layers, wherein the doping profile includes a plurality of portions, each of the portions associated with a different range of substrate depth;

obtaining a resistance at a junction between the position and an overlying layer;

obtaining a capacitance at the junction between the position and the overlying layer; and modeling noise in the integrated circuit substrate using the obtained doping profile, the obtained resistance, and the obtained capacitance for the position.

13. A method for modeling noise present in an integrated circuit substrate, the method comprising:

obtaining a plurality of substrate doping profiles for the integrated circuit substrate, each one of the plurality of substrate doping profiles including a net doping level for each one of a plurality of depths within an integrated circuit substrate;

creating a plurality of subdivisions in each of the doping profiles such that each of the doping profiles includes a plurality of portions, each of the portions being associated with a different range of substrate depth;

ascertaining a position on a surface of the integrated circuit substrate;

obtaining a combination of layers associated with the position, the combination of layers defining a vertical column beneath the position;

obtaining a doping profile associated with the combination of layers; and ascertaining an equivalent resistance associated with each one of the plurality of portions in the obtained doping profile.

14. The method as recited in claim 13, further including:

obtaining a resistance at a junction between the position and an overlying layer;

obtaining a capacitance at the junction between the position and the overlying layer; and modeling noise in the integrated circuit substrate using the equivalent resistance associated with each one of the plurality of portions characterizing the vertical column beneath the position, and the obtained resistance and the obtained capacitance at the junction between the position and the overlying layer.

15. The method as recited in claim 14, wherein the overlying layer is an interconnect line.

16. The method as recited in claim 14, wherein the overlying layer is an integrated circuit device.

17. The method as recited in claim 14, wherein modeling the substrate includes creating a netlist.

* * * * *

UNITED STATES PATENT AND TRADEMARK OFFICE
CERTIFICATE OF CORRECTION

PATENT NO.      : 6,291,322 B1                                                          Page 1 of 1
DATED           : September 18, 2001
INVENTOR(S)     : Francois J.R. Clément It is certified that error appears in the above-identified patent and that said Letters Patent is hereby corrected as shown below:

<u>Title page,</u>
Item [12], change "Clèment" to -- Clément --.
Item [75], change "Clèment" to -- Clément --.

<u>Drawings,</u>
Sheet 2 of 17, Fig. 2A, add node number 222 for node on line b-b' above node 220.

<u>Column 5,</u>
Line 52, change "y-axis" to -- x-axis --.

Signed and Sealed this

Tenth Day of September, 2002

Attest:

JAMES E. ROGAN
*Attesting Officer*        *Director of the United States Patent and Trademark Office*